(12) United States Patent
Yokoyama et al.

(10) Patent No.: US 7,491,582 B2
(45) Date of Patent: Feb. 17, 2009

(54) METHOD FOR MANUFACTURING SEMICONDUCTOR DEVICE AND SEMICONDUCTOR DEVICE

(75) Inventors: Yoshihiko Yokoyama, Chino (JP); Yoshihide Nishiyama, Chino (JP)

(73) Assignee: Seiko Epson Corporation (JP)

( * ) Notice: Subject to any disclaimer, the term of this patent is extended or adjusted under 35 U.S.C. 154(b) by 169 days.

(21) Appl. No.: 11/190,028

(22) Filed: Jul. 26, 2005

(65) Prior Publication Data

US 2006/0073637 A1 Apr. 6, 2006

(30) Foreign Application Priority Data

Aug. 31, 2004 (JP) ............................. 2004-251809
Apr. 12, 2005 (JP) ............................. 2005-114403

(51) Int. Cl.
*H01L 21/44* (2006.01)
*H01L 21/48* (2006.01)

(52) U.S. Cl. ...................... 438/109; 257/777; 257/621

(58) Field of Classification Search ......... 436/109–111; 257/777, 621; 438/109–111
See application file for complete search history.

(56) References Cited

U.S. PATENT DOCUMENTS

| 5,973,396 | A * | 10/1999 | Farnworth | .................. 257/698 |
| 7,214,561 | B2 * | 5/2007 | Tomono et al. | ............. 438/106 |
| 2004/0245623 | A1 * | 12/2004 | Hara et al. | .................. 257/698 |

FOREIGN PATENT DOCUMENTS

| JP | 10-223833 | 8/1998 |
| JP | 2000-277689 | 10/2000 |
| JP | 2002-170919 | 6/2002 |
| JP | 2003-282819 | 10/2003 |
| JP | 2004-55770 | 2/2004 |
| JP | 2004-152812 | 5/2004 |
| JP | 2004-207416 | 7/2004 |
| JP | 2004-221347 | 8/2004 |
| JP | 2004-221349 | 8/2004 |
| JP | 2004-221350 | 8/2004 |
| JP | 2004-297019 | 10/2004 |
| JP | 2008-281880 | 10/2004 |
| JP | 2005-72596 | 3/2005 |
| KR | 10-2004-0066018 | 7/2004 |

OTHER PUBLICATIONS

Communication from Japanese Patent Office regarding corresponding application.

* cited by examiner

*Primary Examiner*—Theresa T Doan
(74) *Attorney, Agent, or Firm*—Harness, Dickey & Pierce, P.L.C.

(57) ABSTRACT

A semiconductor device includes: a connecting body including a connecting electrode; and at least one semiconductor chip stacked on the connecting body, the semiconductor chip including: a substrate; and a trans-substrate conductive plug that penetrates the substrate, the trans-substrate conductive plug having a first terminal that is provided on an active surface side of the substrate; and a second terminal that is provided on a back surface side that is opposite the active surface side, an outer shape of the first terminal being formed larger than an outer shape of the second terminal, wherein the second terminal of the semiconductor chip is electrically connected to a connecting electrode of the connecting body via a brazing material.

6 Claims, 5 Drawing Sheets

METHOD FOR MANUFACTURING SEMICONDUCTOR DEVICE AND SEMICONDUCTOR DEVICE

BACKGROUND OF THE INVENTION

1. Field of the Invention

The present invention relates to a method for manufacturing a semiconductor device, and to a semiconductor device.

Priority is claimed on Japanese Patent Application No. 2004-251809, filed Aug. 31, 2004, and on Japanese Patent Application No. 2005-114403, filed Apr. 12, 2005, the contents of which are incorporated herein by reference.

2. Description of Related Art

In recent years there have been demands for reductions in both the size and weight of portable electronic instruments such as mobile telephones, notebook type personal computers, and personal digital assistants (PDA). In conjunction with this, reductions in the size of various electronic components such as semiconductor devices that are provided inside these instruments have been achieved. This has led to the use of multichip packages in which a plurality of semiconductor chips are arranged inside a single package. In this case, by stacking a plurality of semiconductor chips in the thickness direction thereof, it is possible to obtain a higher semiconductor chip packaging density than when a plurality of semiconductor chips are lined up side by side. From this background, semiconductor chip three-dimensional packaging technology has been proposed. This three-dimensional packaging technology is a technology in which semiconductor chips that each have the same functions or else semiconductor chips that have different functions are stacked. For example, a method is known in which semiconductor chips that are provided with trans-substrate conductive plugs that are located on top of a chip substrate and terminals that are connected to these trans-substrate conductive plugs are stacked after a connection surface of the terminals has undergone activation processing (see, for example, Japanese Unexamined Patent Application, First Publication No. 2002-170919). However, in this method, because the semiconductor chips are constructed with the trans-substrate conductive plugs and the terminals being formed separately on top of the semiconductor chips, the semiconductor chips end up having a considerable size and it has been difficult to efficiently increase the packaging density.

As a result of this, a semiconductor chip has become known in which the packaging density has been improved by reducing the size of the semiconductor chips by forming the trans-substrate conductive plug and the terminal integrally with each other (see, for example, Japanese Unexamined Patent Applications, First Publication Nos. H10-223833 and 2000-277689). When the semiconductor chips are being stacked, they are stacked while terminals that are connected by a trans-substrate conductive plug being aligned. However, because the terminals that are above and below a trans-substrate conductive plug are the same size, when the semiconductor chips are being stacked, it is essential that there is no misalignment between the lower terminal and the upper terminal, so that this alignment of the positions of the semiconductor chips is difficult.

Therefore, a technology has been developed in which the active surface side (i.e., the surface on which an integrated circuit is formed) of a semiconductor chip and the size of the outer shape of the trans-substrate conductive plug that protrudes on the back surface side of the semiconductor chip are formed at different sizes (for example, see Japanese Unexamined Patent Application, First Publication No. 2003-282819. Specifically, the terminal on the active surface side is made larger than the terminal on the back surface side. Accordingly, when semiconductor chips are being stacked, by placing a large terminal in contact with a small terminal it becomes easy to align terminals of adjacent semiconductor chips.

Generally, in order to stack semiconductor chips on an interposer substrate (i.e., on a connecting body) they are bonded together via a solder (i.e., a brazing material) layer.

However, in a conventional manufacturing process for the aforementioned semiconductor chips that are provided with trans-substrate conductive plugs having different outer shapes, it is not possible to form a solder layer on the terminal of the interposer substrate. Accordingly, the solder layer has been formed on the trans-substrate conductive plug terminal that has a large outer shape and protrudes from the active surface side.

As a result, when the semiconductor chips are being stacked on an interposer substrate, they are stacked with the terminal on the active surface side where the solder layer is formed made to face downwards.

When a terminal on the active surface side is connected to the terminal of the interposer substrate, if pressure is applied while heat is supplied from the terminal on the back surface side, the solder layer provided on the terminal on the active surface side is melted and the semiconductor chips are bonded together. At this time, if the temperature at which the solder layers are bonded is too high, the insulating film covering the trans-substrate conductive plug is damaged. Therefore, it is desirable that the bonding temperature be approximately the temperature at which the solder layer melts. Moreover, because the terminals on the active surface side have a larger outer shape than the terminals on the back surface side, a large quantity of the solder layer needs to be melted in order to solder the semiconductor chip and the interposer substrate together.

However, if heat is applied at the melting temperature of the solder layer, then when the heat is conducted from the terminal on the back surface side to the terminal on the active surface, the heat conducts to peripheral portions of the terminal on the active surface side, which has a larger outer shape, and ends up being wasted. As a result, it is not possible for the entire solder layer on the terminal on the active surface side to be melted. Accordingly, in order to melt the entire solder layer, it is necessary to apply heat at a temperature that is sufficiently higher than the melting temperature of the solder layer. This raises the possibility that the aforementioned insulating layer covering the trans-substrate conductive plug will be damaged.

Moreover, for example, a semiconductor chip may be further stacked on top of the semiconductor chip that is stacked on the interposer substrate.

At this time, the solder layer that is provided on the terminal on the active surface side forming the second layer forms an alloy layer at a boundary with the terminal. Accordingly, as the heat to melt the solder layer is first conducted to the alloy layer, the solder layer on the terminal on the active surface side ends up being consumed in the formation of a further solder layer.

Furthermore, when the semiconductor chips are compressed, the terminal on the back surface side of the semiconductor chip forming the first layer are pressed into the solder layer so as to push away the solder layer to peripheral portions of the terminal on the active surface side. As a result, the quantity of solder that is located between the terminal on the active surface side and the terminal on the back surface side is reduced, and there is a possibility that a satisfactory solder bond will not be possible.

Moreover, because the semiconductor chips are stacked with the terminal on the active surface side on which the solder layer is formed facing downwards, when the solder is melted, the solder is influenced by gravity and droops down. If this solder then makes contact with the semiconductor chip provided on the layer beneath it, there is a possibility of short-circuiting occurring.

In recent years, technology has also become established for forming a solder layer on the terminal on the interposer substrate.

SUMMARY OF THE INVENTION

The present invention was conceived in view of the above circumstances and it is an object thereof to provide a method for manufacturing a semiconductor and to also provide a semiconductor that efficiently utilizes heat for melting brazing material and provides an excellent bond when semiconductor chips are stacked via a brazing material on a connecting body.

In order to solve the above-described problem there is provided a method for manufacturing a semiconductor device including a connecting body including a connecting electrode; and at least one semiconductor chip stacked on the connecting body, the semiconductor chip including: a substrate; and a trans-substrate conductive plug that penetrates the substrate, the trans-substrate conductive plug having a first terminal that is provided on an active surface side of the substrate; and a second terminal that is provided on a back surface side that is opposite the active surface side, an outer shape of the first terminal being formed larger than an outer shape of the second terminal, the method including: stacking the semiconductor chip on the connecting body with the second terminal of the semiconductor chip being placed against the connecting electrode of the connecting body on which a brazing material is provided; and electrically connecting the connecting electrode and the second terminal via the brazing material by applying heat and pressure from the first terminal side to the first terminal.

According to this method for manufacturing a semiconductor device, in trans-substrate conductive plugs that are provided with the first terminal and the second terminal, because the second terminal is stacked on a connecting body facing, for example, downwards and heat is applied from the first terminal side, the heat is conducted from the first terminal that has a large outer shape to the second terminal that has a small outer shape.

Accordingly, because the second terminal has a smaller terminal surface area than the first terminal, only a small amount of heat conducts to peripheral portions of the second terminal, and the applied heat can be used efficiently to melt via the second terminal the brazing material that is provided on the connecting electrode of the connecting body. Accordingly, heat can be efficiently used when semiconductor chips are being stacked, and the bonding temperature can be lowered to approximately the melting temperature of the brazing material. Therefore, it is possible to reduce any damage to any insulating film covering the trans-substrate conductive plug.

Moreover, if the applied heat is first conducted to interfaces between the second terminal surfaces and the brazing material on the connecting electrode, an alloy layer is formed at the interface between the second terminal surface and the brazing material so that a reliable bond is formed. Here, the interface between the connecting electrode and the brazing material is already formed as an alloy layer before the heat treatment is performed.

Accordingly, because the brazing material is connected to both the second terminal and the connecting electrode via the alloy layer, the second terminal and the connecting electrode are reliably bonded resulting in an excellent bond being obtained.

Moreover, in this method for manufacturing a semiconductor device, the connecting body may be another semiconductor chip having the same structure as the semiconductor chip, and the brazing material may be provided on a first terminal of the another semiconductor chip that serves as the connecting body, and the method may further include placing the first terminal of the another semiconductor chip and the second terminal of the semiconductor chip that is stacked on top of the another semiconductor chip against each other; and electrically connecting the first terminal of the another semiconductor chip and the second terminal of the semiconductor chip via the brazing material.

Here, a semiconductor chip on which a redistribution layer has been formed by W-CSP (wafer level chip scale package) processing on, for example, the first terminal side thereof is stacked on the semiconductor chip that serves as a connecting body. At this time, by applying heat and pressure from the first terminal side of the semiconductor chip that has undergone W-CSP processing, as described above, the heat is conducted from the first terminal of the semiconductor chip that has undergone W-CSP processing to the second terminal side where the terminal has a smaller outer size. Moreover, the applied heat is conducted first from the second terminal of the semiconductor chip that has undergone W-CSP processing to the brazing material that is provided on the first terminal of the semiconductor chip that serves as a connecting body, so that an alloy layer is formed at the interfaces between the second terminal surface and the brazing material. As a result, a secure bond is made possible. After the semiconductor chip that serves as a connecting body and the semiconductor chip that has undergone W-CSP processing have been stacked, this stacked body is inverted.

In this manner, according to the present invention, it is possible to manufacture a semiconductor device that is provided with a semiconductor chip that is bonded securely to a semiconductor chip that has undergone W-CSP processing.

Moreover, in this method for manufacturing a semiconductor device, at least one second semiconductor chip may be stacked on top of the semiconductor chip, and the brazing material may be provided on a first terminal of the semiconductor chip that is provided as a bottom layer, the method may further include: placing the first terminal of the semiconductor chip and a second terminal of the second semiconductor chip that is stacked on top of the semiconductor chip against each other, and electrically connecting the first terminal of the semiconductor chip and the second terminal of the second semiconductor chip via the brazing material.

According to this type of manufacturing method, when a plurality of semiconductor chips are being stacked, because the first terminal of the semiconductor chip that is provided to form the bottom layer are placed against the second terminal of the semiconductor chip that is stacked on top of this semiconductor chip, heat is conducted from the second terminal to the brazing material that is provided on the first terminal. Accordingly, in the same manner as in the case described above, the brazing material forms an alloy layer at interfaces between the second terminal and the brazing material. Moreover, the interface between the first terminal and the brazing material form an alloy layer from the time when the brazing material is first formed. Accordingly, the second terminal and the first terminal can be securely bonded via the brazing material that has been formed into an alloy layer. Accordingly, an excellent bond is obtained using brazing material and a semiconductor device in which the semiconductor chips are securely stacked can be manufactured.

Moreover, because the first terminal is stacked facing upwards, if the brazing material is melted at the time when the semiconductor chip is stacked, the brazing material is not affected by gravity as it is supported by the first terminal. Accordingly, it is possible to prevent short-circuiting between vertically adjacent semiconductor chips that is caused by dripping brazing material.

Moreover, in this method for manufacturing a semiconductor device, heat and pressure may be applied to each of the at least one second semiconductor chip so as to bond the semiconductor chips.

When this type of manufacturing method is employed, because the semiconductor chips can be securely stacked layer by layer, the reliability of the manufactured semiconductor device can be improved.

Moreover, in this method for manufacturing a semiconductor device, heat and pressure may be applied to the semiconductor chips as a single body so as to bond the semiconductor chips.

When this type of manufacturing method is employed, because the stacked semiconductor chips can be bonded as a single body, the number of steps needed to manufacture a semiconductor device can be decreased and productivity can be improved.

The semiconductor device of the present invention is a semiconductor device including: a connecting body including a connecting electrode; and at least one semiconductor chip stacked on the connecting body, the semiconductor chip including: a substrate; and a trans-substrate conductive plug that penetrates the substrate, the trans-substrate conductive plug having a first terminal that is provided on an active surface side of the substrate; and a second terminal that is provided on a back surface side that is opposite the active surface side, an outer shape of the first terminal being formed larger than an outer shape of the second terminal, wherein the second terminal of the semiconductor chip is electrically connected to a connecting electrode of the connecting body via a brazing material.

In the semiconductor device of the present invention, because the second terminal is stacked on a connecting body facing, for example, downwards, heat is conducted from the first terminal whose terminal outer shape is large to the second terminal whose terminal outer shape is small. Accordingly, as described above, because the second terminal has a smaller terminal surface area than the first terminal, only a small amount of heat conducts to peripheral portions of the terminal, and the applied heat can be used efficiently to melt the brazing material that is provided on the connecting electrode of the connecting body. Accordingly, the bonding temperature can be set to approximately the melting temperature of the brazing material and it becomes possible, for example, to reduce any damage to any insulating film covering the trans-substrate conductive plug, and thereby improve the reliability of the semiconductor device.

Moreover, by applying heat from, for example, the first terminal side of the trans-substrate conductive plugs, the heat is conducted to the second terminal. In addition, the heat is conducted from the second terminal directly to the brazing material that is formed on the connecting electrode of the connecting body. Accordingly, a bond is achieved by forming an alloy layer at interfaces between the second terminal surface and the brazing material. The interface between the connecting electrode and the brazing material form an alloy layer from the time when the brazing material is first formed. Accordingly, the second terminal and the connecting electrode can be securely bonded via the brazing material that has been formed into an alloy layer.

Moreover, for example, when stacking a second semiconductor chip on top of the semiconductor chip that has been stacked on the connecting body, if the brazing material that is used for connecting the other semiconductor chip is formed on top of the first terminal, then even when the brazing material is melted it is still not affected by gravity and made to drip down because it is supported on top of the first terminal. Accordingly, for example, when stacking semiconductor chips, it is possible to prevent short-circuiting caused by dripping brazing material between vertically adjacent semiconductor chips and to thereby improve the reliability when stacking semiconductor chips.

In this semiconductor device, the connecting body may be another semiconductor chip having the same structure as the semiconductor chip, and the brazing material may be provided on a first terminal of the another semiconductor chip that serves as the connecting body. In addition, first terminal of the another semiconductor chip and the second terminal of the semiconductor chip that is stacked on top of the another semiconductor chip may be placed against each other, and the first terminal of the another semiconductor chip and the second terminal of the semiconductor chip may be electrically connected via the brazing material.

Here, if a semiconductor chip on which a redistribution layer has been formed by W-CSP processing on, for example, the first terminal side thereof is stacked on the semiconductor chip that serves as a connecting body, as described above, by applying heat and pressure from the first terminal side of the semiconductor chip that has undergone W-CSP processing, the heat is conducted from the first terminal that have a large outer diameter to the second terminal side that have a small outer diameter. Accordingly, the heat is conducted first from the second terminal of the semiconductor chip that has undergone W-CSP processing to the brazing material that is provided on the first terminal of the semiconductor chip that serves as a connecting body, so that an alloy layer is formed at the interface between the second terminal surface and the brazing material. As a result, a secure bond is made possible.

In this manner, according to the present invention, a semiconductor device is obtained that is provided with a semiconductor chip that is bonded securely onto a semiconductor chip that has undergone W-CSP processing.

Moreover, in this semiconductor device, the first terminal may be formed so as to cover at least a portion of an electrode pad is provided on the substrate.

When this type of structure is employed, because the first terminal is formed directly on at least a portion of the electrode pad, conduction with the electrode pad can be obtained directly via the first terminal without wiring or the like needing to be formed. Accordingly, when obtaining conduction with the electrode pad, it is not necessary to lay wiring to the electrode pad, and it is not necessary to form wiring areas on the substrate of the semiconductor chip. As a result, a reduction in the size of the substrate can be achieved, and it is possible to achieve a reduction in the size of a semiconductor device that is provided with the substrate.

Moreover, in this semiconductor device, the brazing material may be provided on the first terminal of a semiconductor chip that is stacked on top of the connecting body, and a component that is provided with a bump for connecting to the first terminal via the brazing material may be stacked on top of the semiconductor chip.

When this type of structure is employed, then because another component is stacked on the first terminal side of the semiconductor chip, the first terminal is not exposed and damage to the first terminal portion is prevented. As a result, a highly reliable semiconductor device is obtained.

Moreover, if the other component is, for example, an electronic component, then by providing this electronic component a semiconductor device with a greater degree of functionality is obtained.

This semiconductor device may further include a sealing resin provided to cover a connection portion that is connected via the brazing material.

When this type of structure is employed, the connecting portion that is covered by the sealing resin are finished with improved resistance to moisture and the like, and it is possible to lighten the load that acts on bond portions when stress is applied to the semiconductor device.

Accordingly, the connection reliability of the brazing material bond portions is improved and a semiconductor device with a greater degree of reliability is obtained.

BRIEF DESCRIPTION THE DRAWINGS

DETAILED DESCRIPTION OF THE INVENTION

The present invention is described below in detail.

Figure 1:
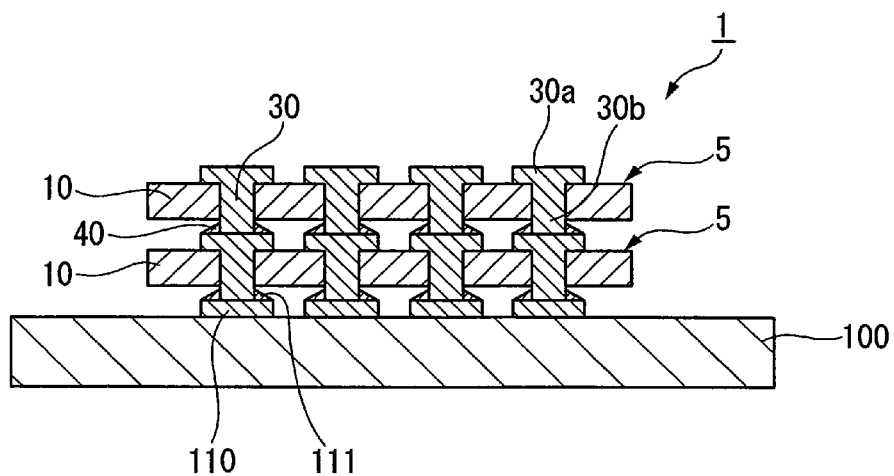
FIG. 1 is an exemplary view showing a first embodiment of the semiconductor device of the present invention.

FIG. 1 is a side cross-sectional view showing in schematic view a semiconductor device that has been obtained using the method for manufacturing a semiconductor device of the present invention. The reference symbol 1 in FIG. 1 indicates a semiconductor device 1. As shown in FIG. 1, the semiconductor device 1 is formed by an interposer substrate (i.e., a connecting body) 100 and a plurality (two in FIG. 1) of the same semiconductor chips 5.

The semiconductor chips 5 are provided with a semiconductor substrate 10 (i.e., a substrate) and trans-substrate conductive plugs 30 that penetrate the semiconductor substrate 10.

Note that in the embodiment described first, the interposer substrate 100 is used as a connecting body, however, this connecting body is not limited solely to the interposer substrate 100 and, as described below, the connecting body may also be formed by a different semiconductor chip that has the same structure as the semiconductor chips 5.

Semiconductor Chip

Figure 2:
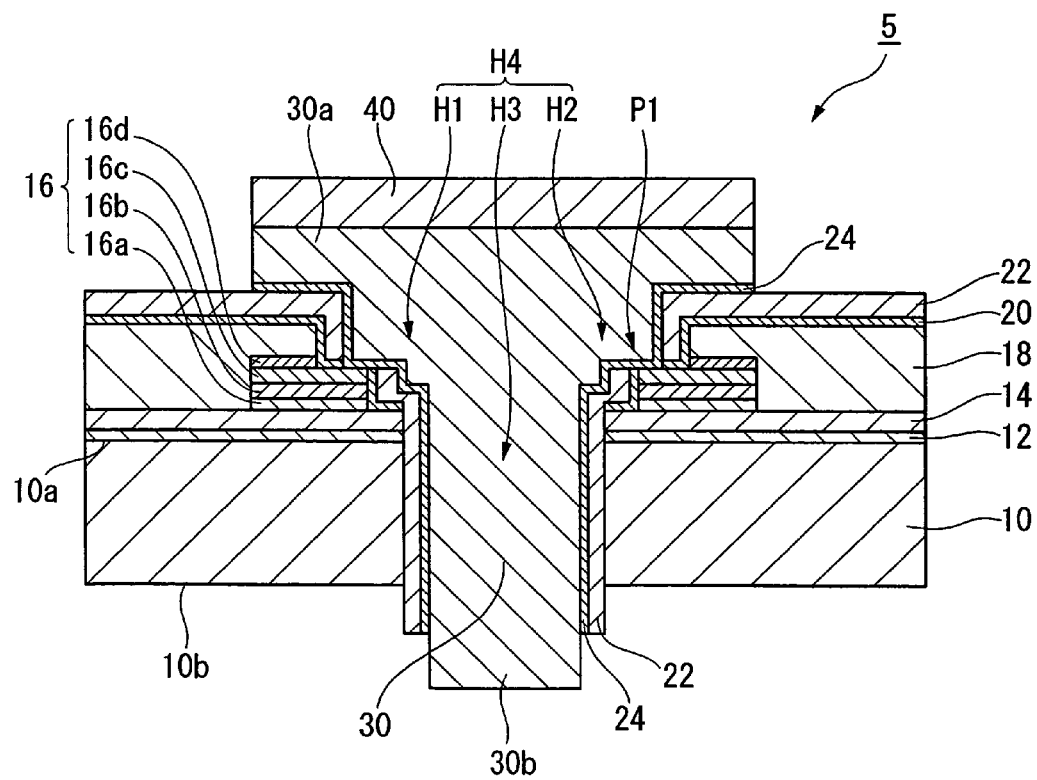
FIG. 2 is an enlarged view showing principal portions of a trans-substrate conductive plug of the semiconductor device.

FIG. 2 is an enlarged, cross-sectional view showing principal portions of the trans-substrate conductive plug 30 of the semiconductor chips 5.

As shown in FIG. 2, the semiconductor substrate 10 is made of silicon and has a thickness of approximately 50 µm. The trans-substrate conductive plug 30 is provided via an insulating film 22 inside a through hole H4 that is formed in the semiconductor substrate 10.

Here, the through hole H4 is formed penetrating from the active surface 10a side of the semiconductor substrate 10 to the back surface 10b side thereof. The semiconductor substrate 10 is formed having an integrated circuit (not shown) formed by transistor and memory elements and by other electronic elements on the active surface 10a side thereof. An insulating film 12 is formed on the surface of the active surface 10a side, and an interlayer insulating film 14 made of borophosphosilicate glass (referred to below as BPSG) or the like is further formed on top of the insulating film 12.

The trans-substrate conductive plug 30 is provided with an active surface side terminal (i.e., a first terminal) that protrudes on the active surface 10a side, and with a back surface side terminal (i.e., a second terminal) that protrudes on the back surface 10b side which is the opposite side from the active surface 10a side. The outer shape of the terminal portion of the active surface side terminal 30a is larger than the outer shape of the terminal portion of the back surface side terminal 30b and, in the present embodiment, is formed in a circular shape or square shape or the like when seen in plan view. Furthermore, a solder (i.e., a brazing material) layer 40 is formed on the active surface side terminal 30a that forms the first layer. Accordingly, the trans-substrate conductive plugs 30 are stacked so that electricity is conducted through the active surface side terminal 30a via the solder layer 40.

A lead-free solder such as, for example, tin/silver or the like is used for the solder layer 40. Examples of methods that may be used to form the solder layer 40 (i.e. deposition methods) include wet plating methods such as electrolytic plating, immersion plating, and electroless plating, chemical vapor deposition (CVD) methods such as thermal CVD, plasma CVD, and laser CVD, dry plating methods such as vacuum evaporation, sputtering, and ion plating, and thermal spraying, metal foil bonding, and the like. Using manufacturing methods such as these, and alloy layer is formed on the solder layer 40 at an interface with the active surface side terminal 30a. Among these methods, wet plating methods are particularly preferable. The solder layer 40 can be formed easily according to a wet plating method.

For example, lead-free solder is used for the solder layer 40, however, it is also possible to use a metal paste or molten paste instead of this.

An electrode pad 16 is formed in a predetermined location on the surface of the interlayer insulating film 14. This electrode pad 16 is formed by stacking in the following sequence a first layer 16a that is made of titanium (Ti) or the like, a second layer 16b that is made of titanium nitride (TiN) or the like, a third layer 16c that is made of aluminum/copper (AlCu) or the like, and a fourth layer 16d that is made of titanium nitride (TiN) or the like. Note that the constituent materials of this electrode pad 16 can be suitably altered in accordance with the electrical characteristics, physical characteristics, and chemical characteristics that are required in the electrode pad 16. For example, it is also possible to form the electrode pad 16 using only Al, which is generally used as an electrode for integration purposes, or to form the electrode pad 16 using only copper which has low electrical resistance.

Here, electrode pads 16 are formed in a row in a peripheral portion of the semiconductor device 1, or else are formed in a row in a center portion of the semiconductor device 1. No integrated circuit is formed beneath these electrode pads 16. A passivation film 18 is formed on a surface of the interlayer insulating film 14 so as to cover these electrode pads 16. The passivation film 18 is made of silicon oxide, silicon nitride, or a polyimide resin and is formed having a thickness of, for example, approximately 1 μm. Note that, as described below, the electrode pads 16 are in contact with each other as a result of their being covered by at least a portion of the active surface side terminal portions 30a so as to be in an electrically connected state.

Moreover, an opening H1 in the passivation film 18 is formed in a center portion of the electrode pad 16, and an opening H2 is also formed in the electrode pad 16. The inner diameter of the opening H1 is formed at approximately 100 μm, while the inner diameter of the opening H2 is formed approximately 60 μm smaller than the inner diameter of the opening H1. An insulating film 20 made of SiO$_2$ or the like is formed on a surface of the passivation film 18 and on inner surfaces of the opening H1 and the opening H2. By employing this type of structure, a hole H3 that penetrates the insulating film 20, the interlayer insulating film 14, the insulating film 12, and the semiconductor substrate 10 is formed in a center portion of the electrode pad 16. The inner diameter of the hole H3 is smaller than the inner diameter of the opening H2 and is formed at, for example, approximately 50 μm. Note that, in the present embodiment, the hole H3 has a circular shape when seen in plan view, however, it is not limited to this and may also have, for example, a rectangular shape when seen in plan view.

An insulating film 22 made of SiO$_2$ or the like is formed on an inner wall surface of the hole H3 and on the surface of the insulating film 20. This insulating film 22 is provided in order to prevent the occurrence of current leaks, as well as corrosion and the like caused by oxygen or moisture or the like and, in the present embodiment, is formed having a thickness of approximately 1 μm. Moreover, one end side of the insulating film 22 is in a state of protruding from the back surface 10b of the semiconductor substrate 10 particularly on the side that covers the inner wall surface of the hole H3.

A portion of the insulating film 20 and insulating film 22 that are formed on the third surface 16c of the electrode pad 16 is removed along the circumferential edge of the opening H2, and an underlying film 24 is formed on the exposed surface of the third layer 16c of the electrode pad 16 and on the exposed surface (i.e., the inner surface) of the insulating layer 22. The underlying film 24 is composed of a barrier layer (i.e., a barrier metal) that is formed on a surface (i.e., an inner surface) of the insulating film 22 and the like, and by a seed layer (i.e., a seed electrode) that is formed on a surface (i.e., an inner surface) of the barrier layer. The barrier layer is provided in order to prevent the conductive material that is used to form the trans-substrate conductive plug 30 (described below) from migrating into the semiconductor substrate 10, and is made of titanium tungsten (TiW), titanium nitride (TiN) or the like. The seed layer is an electrode that is used when the trans-substrate conductive plug 30 (described below) is formed by plating processing, and is formed from copper (Cu), gold (Au), silver (Ag), or the like.

The trans-substrate conductive plug 30, which is formed from a conductive material having low electrical resistance such as Cu, W, or the like, is formed on an inner side of the underlying film 24 in a state of being embedded inside the through hole H4 that is formed by the opening H1, the opening H2, and the hole H3. A material obtained by doping a dopant such as boron (B) or phosphorous (P) in a polysilicon can be used as the conductive material that forms the trans-substrate conductive plug 30. When the trans-substrate conductive plug 30 is formed using such a material, it is no longer necessary to prevent metal migrating into the semiconductor substrate 10. Therefore, the above-described barrier layer can be eliminated.

Moreover, the trans-substrate conductive plug 30 and the electrode pad 16 are electrically connected in the portion P1 shown in FIG. 2. Accordingly, the active surface side terminal 30a of the trans-substrate conductive plug 30 is electrically connected to the electrode pad 16.

As described above, the back surface side terminal portion 30b of the trans-substrate conductive plug 30 that is on the back surface 10b side of the semiconductor substrate 10 is in a state of protruding beyond the back surface 10b of the semiconductor substrate 10. Moreover, the insulating film 22 also protrudes from the back surface 10b of the semiconductor substrate 10, and covers a portion of the side surface portion of the back surface side terminal portion 30b. Accordingly, in a portion of the end surface and side surface portions of the trans-substrate conductive plug 30, a conducting portion is in a state of being exposed from the insulating film 22.

As shown in FIG. 1, a pad 110 (i.e., a connecting electrode) that is electrically connected to the semiconductor chip 5 is formed on a surface of the interposer substrate 100 on which the semiconductor chips 5 are stacked. Moreover, a solder (i.e., a brazing material) layer 111 for bonding to the back surface side terminal 30b of the semiconductor chip 5 is formed on the pad 110. Note that the solder layer 111 and the solder layer 40 that is provided on the active surface side terminal 30a of the semiconductor chip 5 are formed using the same solder, and consequently have the same melting temperature.

In the semiconductor chip 5, the back surface side terminal 30b faces downwards and is placed against the pad 110. As described below, as a result of the solder layer 111 melting and then solidifying, the back surface side terminal 30b and the pad 110 become connected via the solder layer 111, resulting in the semiconductor chip 5 and the interposer substrate 100 becoming connected.

Moreover, the semiconductor chip 5 of the second layer is then stacked such that the back surface side terminal 30b of the semiconductor chip 5 of the second layer is placed against the top of the active surface side terminal 30a of the semiconductor chip 5 of the first layer. As described below, as a result of the solder layer 40 that is formed on top of the active surface side terminal 30a of the semiconductor chip 5 of the first layer melting and then solidifying, the semiconductor chip 5 of the first layer and the semiconductor chip 5 of the second layer become connected via the solder layer 40.

Because no semiconductor chip 5 is stacked on top of the active surface side terminal 30a of the semiconductor chip 5 that is stacked on the topmost layer (in the present embodiment, this is the semiconductor chip of the second layer), the solder layer 40 is not required thereon and, consequently, no solder layer 40 is formed thereon.

The semiconductor device 1 is constructed based on the above-described structure.

Manufacturing Method for Semiconductor Device

Next, a method for manufacturing a semiconductor device 1 that is formed by stacking semiconductor chips 5 that each have the same structure on top of the interposer substrate 100 will be described with reference to FIGS. 3A to 3C.

Figure 3A:
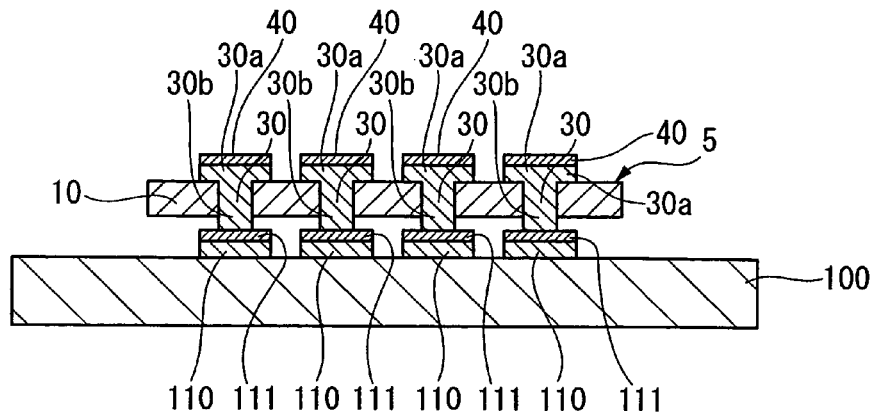
FIGS. 3A to 3C are exemplary views showing a process to manufacture the semiconductor device of the present invention.

Firstly, As shown in FIG. 3A, the back surface side terminals 30b of a semiconductor chip 5 are positioned facing downwards so as to be placed against the solder layers 111 that are provided on the pads 110 that are formed on top of a surface of the interposer substrate 100.

At this time, the wettability of the solder is improved by coating flux (not shown) on the back surface side terminals 30b. A dispensing method, an inkjet method, a transfer method, or the like can be used to coat the flux onto the back surface side terminals 30b.

In addition, in order to prevent the stacked semiconductor chip 5 from moving because of vibration or impact and becoming misaligned, it is also possible to temporarily bond the back surface side terminals 30b to the pads 110 by applying heat or pressure. When this temporary bonding is performed, a lower temperature and weaker pressure are used than those used in the main bonding.

In this manner, the semiconductor chip 5 of the first layer is stacked on top of the interposer substrate 100.

Figure 3B:
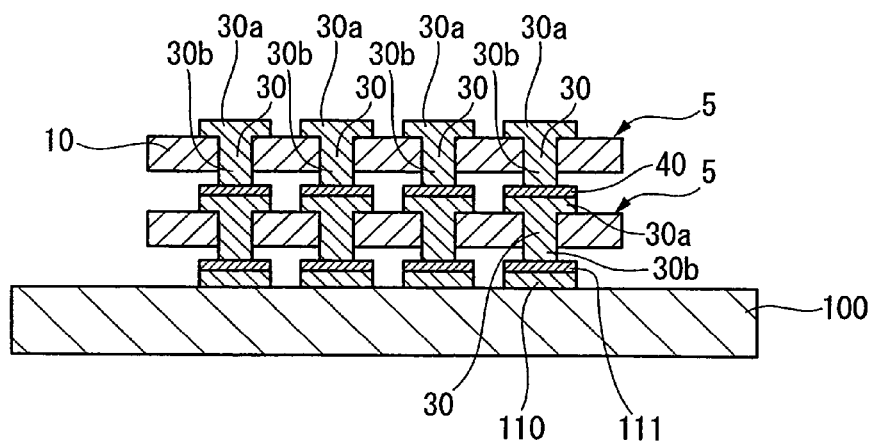

Next, As shown in FIG. 3B, the back surface side terminals 30b of the semiconductor chip 5 that is to be the second layer are positioned facing downwards in contact with the solder layers 40 that are provided on the active surface side terminals 30a of the semiconductor chip 5 that is the first layer. At this time, in the same manner as for the semiconductor chip 5 of the first layer, it is possible for flux to be coated onto the back surface side terminals 30b of the semiconductor chip 5 of the second layer so as to improve the wettability of the solder. Moreover, by applying heat and pressure, the semiconductor chip 5 of the second layer can be temporarily fixed in position.

Figure 3C:
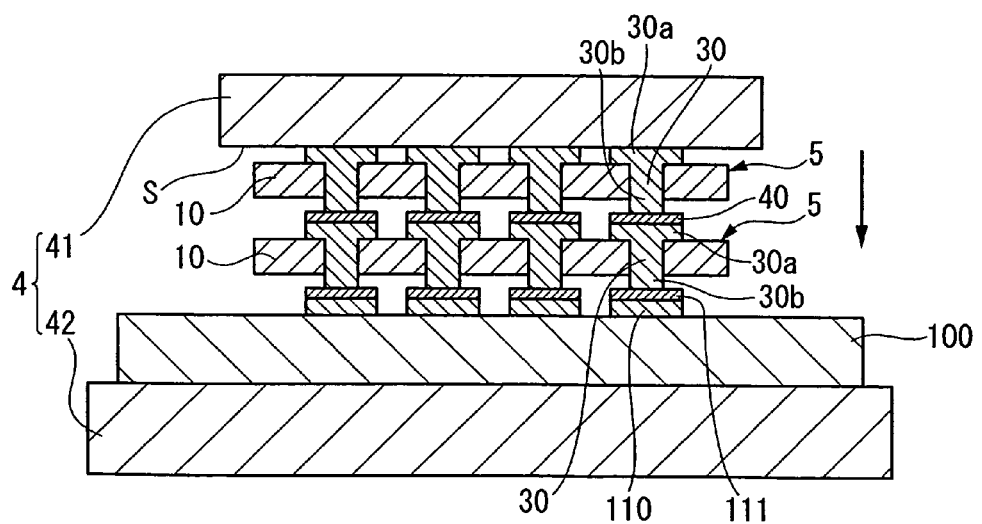

Next, As shown in FIG. 3C, using, for example, a bonding apparatus such as that described below, by applying pressure to the semiconductor chip 5 in the direction shown by the arrow in the drawing as heat is being applied directly from the active surface side terminals 30a side of the semiconductor chip 5 of the second layer, the solder layers 111 that are formed on the pads 110 of the interposer substrate 100 and the solder layers 40 that are formed on the active surface side terminals 30a of the semiconductor chip 5 of the first layer are melted and then solidified. As a result, the interposer substrate 100 and the semiconductor chip 5 of the second layer are electrically bonded.

The bonding apparatus 4 is provided with a bonding stage 42 on which is placed the interposer substrate 100 to which the semiconductor chip 5 has been temporarily bonded, and a bonding tool 41 that is positioned above the bonding stage 42 (i.e., on the upper side in FIG. 3C) and whose surface that faces the bonding stage 42 is in the form of a flat surface S.

The bonding tool 41 and the bonding stage 42 are each in the form of a block, and may be constructed, for example, from various types of metal material, various types of ceramic material, or the like.

A heat source (not shown) that is formed by, for example, a cartridge heater, a ceramic heater, or the like is incorporated in the bonding tool 41.

Note that it is also possible to provide a heat source on the bonding stage 42 side so that, by heating the bonding tool 41 side and the bonding stage 42 side to approximately the same temperature during a heating operation, any temperature difference between the interposer substrate 100 and the semiconductor chip 5 can be eliminated, and the solder can be melted uniformly.

Firstly, when applying heat and pressure using the bonding tool 41, the interposer substrate 100 on which the semiconductor chips 5 have been stacked is placed on the bonding stage 42. At this time, the bonding tool 41 is in a state of being heated to a temperature that enables it to melt the solder layers 40 and the solder layers 111, which are described below.

Next, by placing the bonding tool 41 against the semiconductor chip 5 of the second layer, heat is applied from the active surface side terminals 30a side of the semiconductor chip 5 of the second layer. While heat is being applied, the bonding tool 41 is lowered in the direction indicated by the arrow in FIG. 3C to a predetermined position by a driving mechanism (not shown). As a result, the semiconductor chips 5 and the interposer substrate 10 are pressed.

Here, in the present embodiment, when melting the solder layers 40 and the solder layers 111 that have a melting point of 250° C., the solder bonding is achieved with a heating temperature (i.e., the temperature of the bonding tool 41) of between 250 to 260° C., which is approximately the same temperature as the melting point of the solder layers 40 and the solder layers 111.

As a result, the heat from the bonding tool 41 is conducted to the back surface side terminals 30b from the active surface side terminals 30a of the semiconductor chip 5 that has been stacked to form the second layer. Accordingly, because the surface area of the outer shape of the terminals of the back surface side terminals 30b is smaller than that of the active surface side terminals 30a, only a small amount of heat conducts towards peripheral portions of the back surface side terminals 30b. Therefore, the heat is efficiently conducted, via the back surface side terminals 30b of the semiconductor chip 5 that has been stacked to form the second layer, to the solder layers 40 that are provided on the active surface side terminals 30a of the semiconductor chip 5 that is stacked underneath, and thereby melt these solder layers 40. When the solder layers 40 melt, because the active surface side terminals 30a are stacked facing upwards, the solder layers 40 that are provided on the active surface side terminals 30a are not affected by gravity and made to droop down.

The heat is conducted from the back surface side terminals 30b of the semiconductor chip 5 of the second layer to the solder layers 40 of the semiconductor chip 5 of the first layer so that an alloy layer is formed at the interface between the solder layers 40 and the back surface side terminals 30b. Note that, as described above, the solder layers 40 form an alloy layer at the interface with the active surface side terminals 30a of the first layer so that a reliable connection between the two is formed.

The heat that has been conducted to the active surface side terminals 30a of the first layer is then conducted to the back surface side terminals 30b of the semiconductor chip 5 of the first layer by passing inside the trans-substrate conductive plug 30. In addition, the heat is conducted from the back surface side terminals 30b to the solder layers 111 that are provided on the pads 110 of the interposer substrate 100, and these solder layers 111 are melted.

At this time, in the same manner as when the semiconductor chip 5 of the first layer is bonded by solder to the semiconductor chip 5 of the second layer, the solder forms an alloy layer at the interface between the back surface side terminals 30b and the solder layers 111 as a result of the heat being conducted from the back surface side terminals 30b of the semiconductor chip 5 of the first layer to the solder layers 111. Accordingly, the semiconductor chip 5 of the first layer and the pads 110 of the interposer substrate 100 are reliably connected by an alloy layer.

Subsequently, the heating of the bonding tool 41 by the heat source is terminated, and the solder layers 40 and the solder layers 111 are once again solidified (i.e., hardened). Accordingly, the semiconductor chip 5 that is the first layer is stacked via the solder layers 111 on the interposer substrate 100, and the semiconductor chip 5 that is the second layer is also reliably bonded via the solder layers 40 onto this first semiconductor chip 5.

Moreover, by filling the spaces between the interposer substrate 100 and the semiconductor chip 5 and between the two stacked semiconductor chips with nonconductive underfill (not shown), the semiconductor chips 5 can be held and fixed stably on the interposer substrate 100 while, at the same time, locations other than the bonds between terminals can be insulated.

Finally, the stacked body that is formed by the semiconductor chips 5 being stacked on top of the interposer substrate 100 is removed from the bonding apparatus 4 so that the semiconductor device 1 shown in FIG. 1 is obtained.

In the present embodiment, heat and pressure are applied to the semiconductor chips 5 that are stacked into a single body so as to bond them onto the interposer substrate 100, however, it is also possible to apply heat and pressure to each single layer of semiconductor chips 5 so that these are stacked reliably layer by layer.

At this time, when heat and pressure are applied by the bonding tool 41, if the solder layers 40 are formed on the active surface side terminals 30a, the solder layers 40 are melted. Therefore, the semiconductor chips 5 can be stacked by once again forming the solder layers 40 on top of the active surface side terminals 30a on which the solder layers 40 have already melted.

Moreover, it is also possible to stack the semiconductor chips 5 in sequence by forming the solder layers 40 on top of the active surface side terminals 30a of the semiconductor chips 5 each time a single semiconductor chip 5 layer is stacked.

Note that, when only a single semiconductor chip 5 layer is being stacked on top of the interposer substrate 100, because it is not necessary to bond the active surface side terminals 30a of one semiconductor chip 5 with the back surface side terminals 30b of a second semiconductor chip 5 using solder, it is not necessary to form the solder layers 40 on top of the active surface side terminals 30a of the semiconductor chip 5.

In this method for manufacturing a semiconductor device 1, because the semiconductor chips 5 are stacked on top of the interposer substrate 100 with the back surface side terminals 30b of the trans-substrate conductive plug 30 facing downwards, and heat is applied from the heat source of the bonding tool 41 from the active surface side terminals 30a side, the heat is conducted from the active surface side terminals 30a that have a large outer shape to the back surface side terminals 30b side that have a small outer shape. Accordingly, because the surface area of the back surface side terminals 30b is smaller than that of the active surface side terminals 30a, only a small amount of heat conducts to peripheral portions of the back surface side terminals 30b. Therefore, the heat can be efficiently used to melt, via the back surface side terminals 30b, the solder layers 111 that are provided on the pads 110 of the interposer substrate 100. Accordingly, by efficiently using heat, bonding can be achieved at the melting temperature of the solder layers 111. Moreover, it is possible to lower the melting temperature of the solder compared with when the active surface side terminals 30a are stacked facing downwards, and damage to the insulating film 24 that covers the trans-substrate conductive plug 30 can be reduced.

Moreover, the heat causes formation of an alloy layer at the interface between the back surface side terminals 30b and the solder layers 111 on the pads 110, and is able to achieve a reliable bond. Note that, at the interface between the pads 110 and the solder layers 11, the alloy layer is already formed when the solder layers 111 are formed.

Accordingly, once the solder layers 111 have been connected via alloy layers to both the back surface side terminals 30b and the pads 110, and the back surface side terminals 30b and the pads 110 have been reliably bonded, the solder layers 111 are hardened. Therefore, it is possible to obtain excellent solder bonds.

Moreover, when stacking a plurality of layers (two layers in the present embodiment) of the semiconductor chips 5, because the active surface side terminals 30 of the semiconductor chip 5 that is provided as the first layer are positioned so as to be placed against the back surface side terminals 30b of the semiconductor chip 5 that is stacked to form the second layer, heat is conducted from the back surface side terminals 30b to the solder layers 40 that are provided on the active surface side terminals 30a. Accordingly, as described above, the solder layers 40 form alloy layers at the interfaces between the back surface side terminals 30b and the active surface side terminals 30a.

Moreover, alloy layers are formed when the solder layers 40 are formed at the interfaces between the active surface side terminals 30a and the solder layers 40. Accordingly, due to these alloy layers the solder layers 40 are able to reliably bond the back surface side terminals 30b with the active surface side terminals 30a. Therefore, an excellent solder bond is made possible and a semiconductor device 1 in which the semiconductor chips 5 are reliably stacked can be manufactured.

Moreover, because the active surface side terminals 30a are stacked facing upwards on the interposer substrate 100, when the solder layers 40 are melted on top of the active surface side terminals 30a, the solder layers 40 that are provided on the active surface side terminals 30a are not affected by gravity and made to droop down. Consequently, it is possible to prevent short-circuiting between vertically adjacent semiconductor chips 5 that is caused by the solder drooping down.

Furthermore, when the semiconductor chips 5 are bonded by being heated and compressed one layer at a time, because it is possible to reliably stack the semiconductor chips layer by layer, the reliability of the semiconductor device that is manufactured can be improved.

Moreover, when the semiconductor chips 5 are heated and compressed as a single body, because the stacked semiconductor chips 5 can be bonded as a single body, the number of steps required to manufacture the semiconductor device 1 can be decreased and the productivity improved.

According to the semiconductor device 1 of the present invention, as described above, because heat can be used efficiently to melt the solder layers 111 that are provided on the pads 110 of the interposer substrate 100, the heat that is applied to the semiconductor chips 5 can be set to approximately the melting temperature of the solder, so that damage to the insulating film 24 that covers the trans-substrate conductive plugs 30 can be reduced. As a result, the reliability of the semiconductor chips 5 is improved and the reliability of the semiconductor device 1 that is provided with these semiconductor chips 5 can also be improved.

Because the solder forms alloy layers at the interfaces of connecting portions between the respective terminals and thereby forms a bond, the reliability of the bond portions can be improved.

When the semiconductor chips are stacked as described above, it is possible to prevent short-circuiting between vertically adjacent semiconductor chips 5 and to obtain a semiconductor device 1 that is extremely reliable.

Moreover, because the active surface side terminals 30a are electrically connected to a portion of the electrode pads 16 as a result of at least a portion of the active surface side terminals 30a covering the electrode pads 16, it is possible to increase the electrical contact area when conductivity with the electrode pads 16 is obtained via the active surface side terminals 30a. Accordingly, when obtaining conductivity with the electrode pads 16, by eliminating wiring formation areas on the semiconductor substrate 10 that are connected to the electrode pads 16, a reduction in the size of the semiconductor substrate 10 can be achieved, and a reduction in the size of the semiconductor device 1 that is provided with the semiconductor substrate 10 can also be achieved.

Note that, in the above-described semiconductor device 1, it is also possible to provide a sealing resin that covers connecting portions that are connected via a brazing material.

Figure 4:
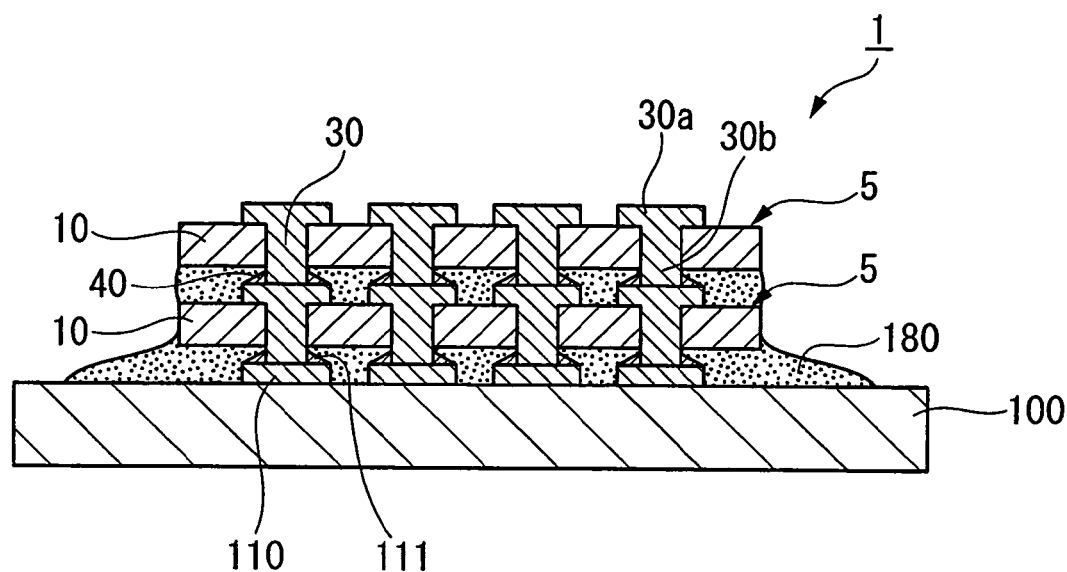
FIG. 4 is a side cross-sectional view showing a semiconductor device provided with sealing resin.

Specifically, As shown in FIG. 4, a sealing resin 180 that is made of an epoxy or a silicone resin or the like is provided so as to cover bond portions formed by the solder layers 111 between the pads 110 on the interposer substrate 100 and the back surface side terminals 30b of the semiconductor chip 5 of the first layer, as well as bond portions formed by the solder layers 40 between the active surface side terminals 30a of the semiconductor chip 5 that is stacked to form the first layer and the back surface side terminals 30b of the semiconductor chip 5 that is stacked to form the second layer.

The sealing resin 180 is also provided so as to fill the spaces between the interposer substrate 100 and the semiconductor chip 5 and between stacked semiconductor chips 5. It is preferable that a low stress resin in which residual stress is suppressed is used for the sealing resin 180. Accordingly, it is possible to reduce the effects of residual stress on the bonded portions.

Because the bond portions between semiconductor chips 5 that are stacked on the interposer substrate 100 are covered by the sealing resin 180 when this type of structure is employed, the resistance to moisture and humidity is improved, and it is possible to reduce the load that acts on the bond portions of the solder layers when stress is applied to the semiconductor device 1. Accordingly, the connection reliability of the semiconductor device 1 is improved, and a more reliable semiconductor device 1 can be obtained.

Figure 5:
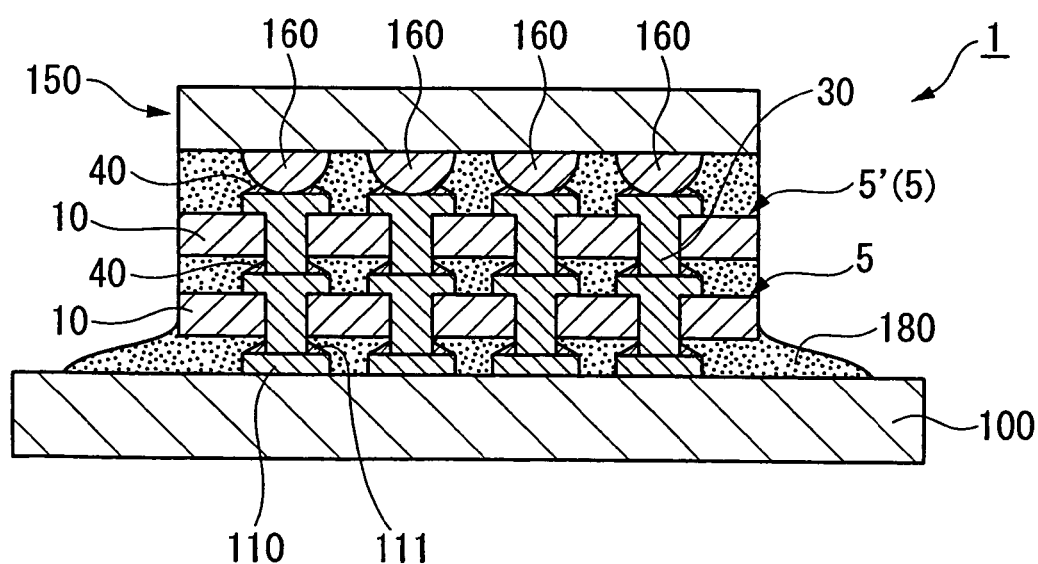
FIG. 5 is a side cross-sectional view showing a semiconductor device provided with another component.

As shown in FIG. 5, it is also possible to stack other components on the semiconductor chip 5' that is formed on the topmost layer from among all the semiconductor chips 5 that are stacked on the interposer substrate 100. Examples of other components include an electronic component 150 such as, for example, an IC chip. Here, solder layers 40 are provided on a top surface of active surface side terminals 30a of the semiconductor substrate 5'. In addition, the electronic component 150 is provided with bumps 160 that are used to make a connection via the solder layers 40 with the active surface side terminals 30a' of the semiconductor chip 5'. These bumps 160 are positioned so as to be superimposed on the trans-substrate conductive plugs 30 of the semiconductor chip 5' when seen in plan view.

Based on this structure, in the electronic component 150, the bumps 160 are reliably connected via the solder layers 40 with the active surface side terminals 30a. Accordingly, as a result of providing the semiconductor device 1 with the aforementioned electronic component 150, a greater degree of functionality is obtained.

Moreover, in the same manner as in the case described in FIG. 4, the sealing resin 180 is provided between semiconductor chips 5 that are connected via the solder layers 40 and between the semiconductor chip 5' in the electronic component 150.

Accordingly, in the bond portions formed by the solder layers 40, a more reliable semiconductor device 1 is obtained as a result of the sealing resin 180 heightening the resistance to moisture and increasing the strength.

Second Embodiment

Next, a description will be given of a semiconductor device 2 of another embodiment that is obtained using the semiconductor device manufacturing method of the present invention.

Figure 6:
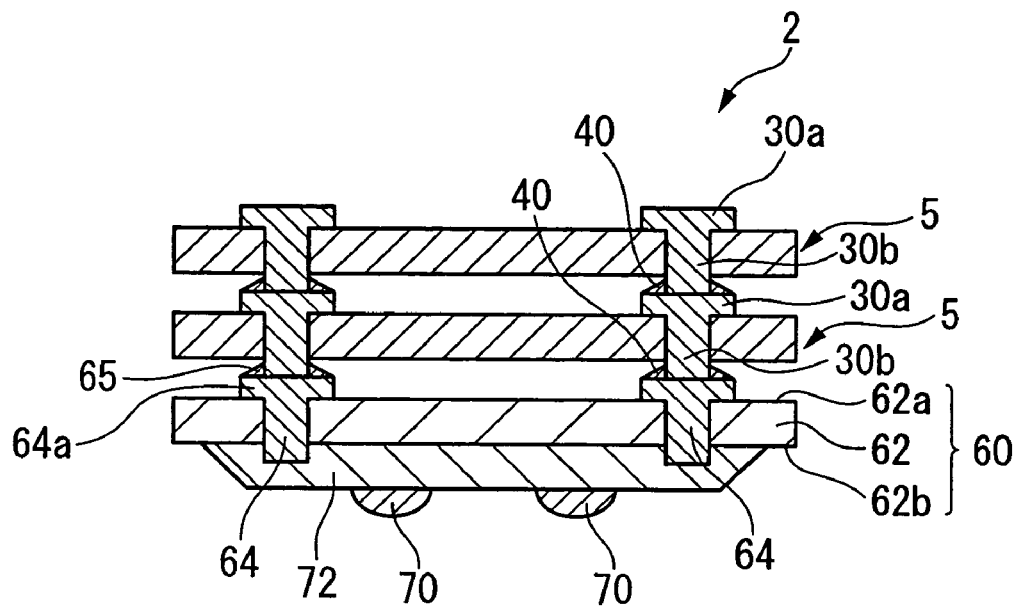
FIG. 6 is an exemplary view showing a second embodiment of the semiconductor device of the present invention.

FIG. 6 is a cross-sectional view showing a state in which semiconductor chips 5 are stacked on a substrate 60 that is subjected to a wafer level chip scale package (W-CSP) process using W-CSP technology as a connecting body.

As shown in FIG. 6, the semiconductor device 2 is constructed by stacking on the W-CSP processed substrate 60 a plurality (two layers in FIG. 6) of semiconductor chips that have the same structure as the semiconductor chip 5 used in the above-described embodiment. In the same manner as in the above-described embodiment, the semiconductor chip 5 is connected to connection terminals that are formed on the W-CSP processed substrate 60 (described below) with the back surface side terminals 30b of the semiconductor chip 5 facing downwards.

Here, the W-CSP technology is a technology in which a wafer is diced to separate semiconductor chips after a formation of a redistribution layer (i.e., are rewiring) and a resin sealing on the wafer.

The W-CSP processed substrate 60 has a substrate 62 that is made, for example, of silicon or the like, and a plurality of connecting electrodes 64 that are connected to a semiconductor chip 5 are formed in rows on the substrate 62.

The connecting electrodes 64 are formed so as to penetrate the substrate 62, and are formed in a shape whereby they protrude from the active surface 62a of the substrate 62 and the back surface 62b of the substrate 62. In addition, a redistribution layer (not shown) is formed on the back surface 62b side of the substrate 62. One end of this redistribution layer is connected to a connecting electrode 64, while a bump 70 that forms an external connection terminal is connected to the other end of the redistribution layer. By forming the redistribution layer and bumps 70 that are electrically connected to the connecting electrodes 76 in this manner, the pitch and layout of the connecting electrodes 64 are converted.

Moreover, solder layers 65 that are used to make connections with the back surface side terminals 30b of the semiconductor chip 5 are formed on the active surface side connecting electrodes 64a that protrude from the active surface 62a side of the substrate 62.

Note that, in FIG. 6, the reference symbol 72 is a stress buffer layer that is formed in order to relieve any stress on the redistribution layer that is imparted through the bumps 70.

In the semiconductor device 2 having the form shown in FIG. 6, because the semiconductor chips 5 are stacked on the thin substrate 62, increased integration can be achieved while the height of the semiconductor device 2 is kept low. Furthermore, by forming the redistribution layer and the bumps 70 on the substrate 62, modification of the pitch and layout of the connecting electrodes 64 that are formed on the substrate 62 becomes possible. Consequently, the degree of freedom when forming the wiring on a substrate that is made of glass epoxy or the like on which the semiconductor device 2 is mounted is increased, and still higher integration is made possible.

In the same manner as in the above-described embodiment, in order to stack semiconductor chips 5 on the W-CSP processed substrate 60, the semiconductor chip 5 of the first layer is positioned on the solder layers 65 with the back surface side terminals 30b of the semiconductor chip 5 of the first layer facing downwards and the active surface side connecting electrodes 30a thereof facing upwards. At this time, it is also possible to temporarily fix the semiconductor chip 5 onto the top of the W-CSP processed substrate 60 by applying heat and pressure such that the positioned semiconductor chip 5 does not shift.

Next, the solder layers 40 that are formed on the back surface side terminals 30b of the semiconductor chip 5 of the second layer are positioned on the active surface side terminals 30a of the semiconductor chip forming the first layer. At this time, it is also possible to temporarily fix the semiconductor chips 5 in position by applying heat and pressure in the same manner as for the semiconductor chip 5 of the first layer.

After the semiconductor chips 5 have been positioned and temporarily fixed onto the W-CSP processed substrate 60, using, for example, the bonding apparatus 4 or the like, the semiconductor chips 5 can be bonded using solder as a single body and stacked on the W-CSP processed substrate 60 by applying heat and pressure from the active surface side terminals 30a side of the stacked semiconductor chips 5.

Moreover, it is also possible to stack the semiconductor chips 5 on the W-CSP processed substrate 60 by applying heat and pressure each time a semiconductor chip 5 layer is stacked.

According to the semiconductor device 2 and the method for manufacturing the semiconductor device 2 of the present invention, the semiconductor chips 5 are stacked on the W-CSP processed substrate 60 with the back surface side terminals 30b of the trans-substrate conductive plugs 30 of the semiconductor chips 5 facing downwards, and, in the same manner as in the above-described embodiment, heat is applied from the active surface side terminals 30a side using the heat source of the bonding tool 41. Accordingly, the heat is conducted from the active surface side terminals 30a, which have a larger outer shape, of the semiconductor chips 5 to the back surface side terminals 30b, which have a small outer shape. At this time, because the surface area of the back surface side terminals 30b is smaller than that of the active surface side terminals 30a, only a small amount of heat conducts to peripheral portions of the back surface side terminals 30b, and the heat can be efficiently used to melt the solder layers 65 that are provided on the connecting electrodes 64 of the W-CSP processed substrate 60 via the back surface side terminals 30b.

Moreover, the heat that is applied to the semiconductor chips 5 can be set to approximately the melting temperature of the solder, so that damage to the insulating film 24 that covers the trans-substrate conductive plugs 30 of the semiconductor chips 5 can be reduced. As a result, the reliability of the semiconductor chips 5 is improved and the reliability of the semiconductor device 2 on which these semiconductor chips 5 have been stacked can be improved.

Moreover, in the same manner as in the above-described embodiment, because the solder layers 40 and the solder layers 65 form alloy layers at the interfaces with the respective connecting electrode portions and thereby form bonds, highly reliable bond portions can be formed.

When other semiconductor chips 5 are stacked on a semiconductor chip 5 whose structure is the same, as is described in the above embodiment, it is possible to prevent short-circuiting between vertically adjacent semiconductor chips 5 when the semiconductor chips 5 are stacked, and to obtain a semiconductor device 2 that is extremely reliable.

Note that the range of the technology of the present invention is not limited to the above embodiment and various modifications can be made without departing from the spirit or scope of the present invention. For example, in the present embodiment, a description is given of a semiconductor device 1 that is obtained by stacking two layers of semiconductor chips 5, however, the semiconductor device 1 can also be constructed by stacking three or more layers of semiconductor chips.

Third Embodiment

Next, a description will be given of a semiconductor device according to another embodiment that is obtained using the method for manufacturing a semiconductor device of the present invention.

Here, for the semiconductor device of the present embodiment, a semiconductor chip 7 that has the same structure as that of the semiconductor chips 5 is used as the connecting body. A brazing material is provided on a first terminal of this semiconductor chip 7, and this first terminal is electrically connected via the brazing material to a second terminal of the semiconductor chip 5 that is stacked on top of the semiconductor chip 7.

As described below, the semiconductor chip 5 on which a redistribution layer has been formed on an active surface 10a side by W-CSP processing has the same structure as the semiconductor chips 5 in the above-described embodiments apart from the fact that this a redistribution layer is formed thereon. Accordingly, the description below is given with the same descriptive reference symbols being used for the same structures.

Figure 7:
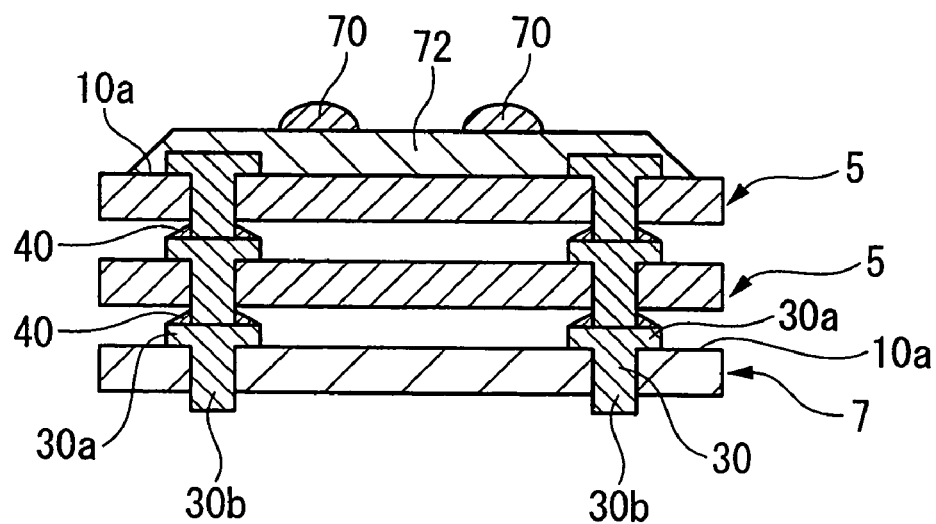
FIG. 7 is an exemplary view showing a third embodiment of the semiconductor device of the present invention.

FIG. 7 shows a side cross-sectional view of a semiconductor device 3 of the present embodiment.

As shown in FIG. 7, the semiconductor chip 7 that is used as the connecting body is formed as the bottommost layer (i.e., on the bottom side in FIG. 7). In addition, a redistribution layer is formed by W-CSP processing on the active surface 10a side of the semiconductor chip 5 that forms the topmost layer (i.e., on the top side in FIG. 7) from among the plurality of stacked semiconductor chips 5. Note that, in the manufacturing steps described below, a semiconductor chip 5 is stacked on top of the semiconductor chip 7 which serves as the connecting body.

As shown in FIG. 7, a solder layer (i.e., a brazing material) 40 is provided on the active surface side terminals 30a of the semiconductor chip 7 that serves as a connecting body. These active surface side terminals 30a and the back surface side terminals 30b of the semiconductor chip 5 that is stacked on top of the semiconductor chip 7 are electrically connected via the solder layers 40. Note that, in the present embodiment, a structure is employed in which two layers of the semiconductor chips 5 are stacked on top of the semiconductor chip 7, which serves as a connecting body, however, the present invention is not limited to this and it is also possible to employ a structure in which two or more layers of the semiconductor chips 5 are stacked.

A redistribution layer (not shown) is formed by W-CSP processing on the active surface 10a side of the topmost semiconductor chip 5, and this redistribution layer is connected to the active surface side terminals 30a that protrude on the active surface 10a side. The opposite side of the wiring portion that is connected to the active surface side terminals 30a is connected to bumps 70 that form external connection terminals. These bumps 70 are placed in desired positions, and the pitch and layout of the active surface side terminals 30a of the semiconductor chips 5 are modified (i.e., the wiring is redistributed) by connecting the bumps 70 and the active surface side terminals 30a using this wiring portion. Note that the reference symbol 72 is a stress buffer layer that is formed in order to relieve any stress on the redistribution layer that is imparted through the bumps 70.

Next, the method for manufacturing the semiconductor device 3 will be described.

To manufacture this semiconductor device 3, a separate semiconductor chip 7 having the same structure as that of the semiconductor chip 5 is used as a connecting body. The active surface side terminals 30*a* of the semiconductor chip 7 and the back surface side terminals 30*b* of the semiconductor chip 5 that is stacked on top of the semiconductor chip 7 are positioned so as to be in contact with each other and are stacked in sequence. A redistribution layer is formed by W-CSP processing on the active surface 10*a* side of a final semiconductor chip 5 and this semiconductor chip 5 is positioned and stacked as the topmost layer. At this time, it is also possible to temporarily fix the semiconductor chips 5 onto the semiconductor chip 7 that forms the connecting body by applying heat and pressure such that the semiconductor chips 5 that have been positioned on the semiconductor chip 7 do not shift.

In the present embodiment, after the semiconductor chips 5 have been positioned or temporarily fixed onto the semiconductor chip 7, using, for example, the above-described bonding apparatus 4 or the like, the semiconductor chips 5 can be bonded using solder as a single body and stacked on the semiconductor chip 7 by applying heat and pressure from the active surface 10*a* side on the topmost layer, namely, from the surface side on which the redistribution layer has been formed by W-CSP processing. At this time, the applied heat is conducted from the active surface side terminals 30*a* of the semiconductor chips 5 that have undergone W-CSP processing to the back surface side terminals 30*b* thereof. The heat is then conducted in sequence from these back surface side terminals 30*b* to the active surface side terminals 30*a* of the semiconductor chip 5 forming the layer below. Here, in the bond portions of the semiconductor chips 5, the applied heat is conducted from the back surface side terminals 30*b* that have a small outer shape to the solder layers 40 that are provided on the active surface side terminals 30*a* that have a large outer shape. In addition, this heat is conducted from the solder layers 40 to the active surface side terminals 30*a* and, in the same manner, forms solder bonds as a result of being transmitted into the bond portions between the semiconductor chips 5 of lower layers. In this manner, as described above, by efficiently using heat, excellent bonds are possible from the alloy layers in the bond portions that are formed by solder layers.

Note that it is also possible to stack the semiconductor chips 5 by applying heat and pressure each time a semiconductor chip 5 layer is stacked on the semiconductor chip 7. By stacking the semiconductor chip 7, which forms a connecting body, and the W-CSP processed semiconductor chips 5 in this manner, the semiconductor device 3 of the present embodiment is completed.

Here, by vertically inverting the semiconductor device 3 of the present embodiment, the semiconductor device 3 can also be used as a semiconductor device that is provided with a plurality of semiconductor chips that are stacked on top of a semiconductor chip 5 that has undergone W-CSP processing.

According to the method for manufacturing the semiconductor device 3 of the present embodiment, by applying heat and pressure from the active surface side terminals 30*a* of a semiconductor chip 5 that has undergone W-CSP processing, as described above, in the bond portions of the semiconductor chips 5 heat is conducted from the back surface side terminals 30*b* that have a small outer shape to the active surface side terminals 30*a* that have a large outer shape. Specifically, as a result of the applied heat being first conducted from the back surface side terminals 30*b* of a semiconductor chip 5 that has undergone W-CSP processing to the solder layers 40 that are provided on the back surface side terminals 30*b* of the semiconductor chip 7 which serves as a connecting body, as described above, an alloy layer is formed at the interfaces between the back surface side terminals 30*b* and the solder layers 40, and these two can be reliably bonded.

In addition, the heat conducts through the trans-substrate conductive plugs 30 so that, in the same manner, an alloy layer is formed in the bond portions of the semiconductor chip 5 forming the next layer down and a bond is obtained.

According to the present invention, it is possible to manufacture a semiconductor device 3 that is provided with the semiconductor chips 5 and 7 that are bonded excellently onto a semiconductor chip 5 that has undergone W-CSP processing.

Figure 8:
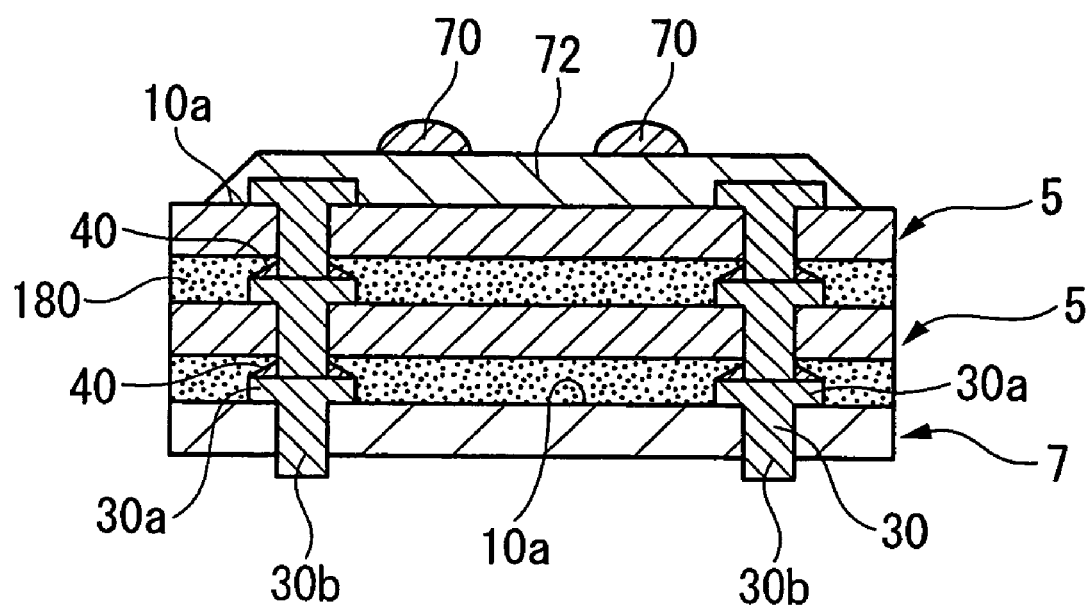
FIG. 8 is a side cross-sectional view in which sealing resin is provided in the semiconductor device shown in FIG. 7.

Note that, in the same manner as described above (see FIGS. 4 and 5), it is also possible in the semiconductor device 3 of the present embodiment as well to employ a structure in which the bond portions that are formed by solder layers between the active surface side terminals 30*a* and the back surface side terminals 30*b* of the semiconductor chips 5 and 7 are covered by a sealing resin 180, As shown in FIG. 8. When this type of structure is employed, the sealing resin 180 increases the moisture proof properties and strength in the bond portions formed by the solder layers so that a more reliable semiconductor device 3 is obtained.

Note also that it is also possible to provide an electronic component 150 such as that shown in FIG. 5 on the topmost semiconductor chip 7 of the semiconductor device 3 of the present embodiment so as to form a semiconductor device 3 having a greater degree of functionality.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

What is claimed is:

1. A method for manufacturing a semiconductor device comprising:
   providing a connecting body including:
      a connecting electrode; and
      at least one semiconductor chip stacked on the connecting body, the semiconductor chip including:
         a substrate; and
         a trans-substrate conductive plug that penetrates the substrate, the trans-substrate conductive plug having:
            a first terminal that is provided on an active surface side of the substrate; and
            a second terminal that is provided on a back surface side that is opposite the active surface side, an outer shape of the first terminal being formed larger than an outer shape of the second terminal;
   providing a brazing material on the connecting electrode of the connecting body;
   stacking the semiconductor chip on the connecting body with the second terminal of the semiconductor chip being placed against the connecting electrode of the connecting body; and
   electrically connecting the connecting electrode and the second terminal via the brazing material by applying heat and pressure directly from a first terminal side to the first terminal.

2. The method for manufacturing a semiconductor device according to claim 1,
wherein the connecting body is another semiconductor chip having the same structure as the semiconductor chip, and the brazing material is provided on a first terminal of the another semiconductor chip that serves as the connecting body, the method further comprising:
placing the first terminal of the another semiconductor chip and the second terminal of the semiconductor chip that is stacked on top of the another semiconductor chip against each other; and
electrically connecting the first terminal of the another semiconductor chip and the second terminal of the semiconductor chip via the brazing material.

3. The method for manufacturing a semiconductor device according to claim 1, wherein at least one second semiconductor chip is stacked on top of the semiconductor chip, and the brazing material is provided on a first terminal of the semiconductor chip that is provided as a bottom layer, the method further comprising:

placing the first terminal of the semiconductor chip and a second terminal of the second semiconductor chip that is stacked on top of the semiconductor chip against each other, and
electrically connecting the first terminal of the semiconductor chip and the second terminal of the second semiconductor chip via the brazing material.

4. The method for manufacturing a semiconductor device according to claim 3, wherein heat and pressure are applied to each of the at least one second semiconductor chip so as to bond the semiconductor chips.

5. The method for manufacturing a semiconductor device according to claim 3, wherein heat and pressure are applied to the semiconductor chips as a single body so as to bond the semiconductor chips.

6. The method for manufacturing a semiconductor device according to claim 1, wherein the connecting body is a wafer level chip scale package processed substrate.

* * * * *